April 28, 1964 SEENING YEE 3,131,317

HIGH FREQUENCY BISTABLE TRANSISTOR COUNTER

Filed March 20, 1962

INVENTOR.
SEENING YEE

BY O. E. Hodges
ATTY.

L. [signature] AGENT.

3,131,317

HIGH FREQUENCY BISTABLE TRANSISTOR COUNTER

Seening Yee, Whitestone, N.Y., assignor, by mesne assignments, to the United States of America as represented by the Secretary of the Navy Filed Mar. 20, 1962, Ser. No. 181,216
5 Claims. (Cl. 307—88.5)

This invention relates to a high speed transistor pulse counter, and more particularly to a binary transistor counter capable of counting square wave pulses, pulses which occur at high frequency rates without error.

Many varieties of counting circuits employing transistors now exist in the prior art. The most familiar of these are of the flip-flop binary counter variety in which a pair of like transistors are cross-connected to provide two stable states of operation in which one of the transistors is conducting while the other is maintained in a non-conductive state. Each pulse which is to be counted is applied to both transistors and has the effect of reversing the conductive and non-conductive states existing prior to that time. At high frequencies, however, these simple flip-flops become quite susceptible to errors whereby pulses are dropped or added from the true count. The arrangement whereby the pulses to be counted are applied to both transistors is the main reason for such errors due to the fact that the state of the flip-flop may not have completely changed by the time a subsequent pulse is applied thereto. A subsequent pulse, in such a situation, will merely aid the change which is already taking place, thus resulting in that pulse not being counted. Also, if an incoming pulse were of a duration longer than the time needed for the change over, the last portion thereof might be interpreted by the transistors as a subsequently occurring pulse thus resulting in an addition to the true count.

Certain techniques have been employed in the past to extend the range of older types of counters to high frequencies. However, the primary difficulty found in using these established techniques is brought about because the ordinary steering gates are not capable of operating at high frequencies in the order of ten megacycles nor are conventional delay lines capable of providing the necessary 50 to 100 millimicroseconds delay needed for such ten megacycle operation. At least, there existed no reliable method by which these two difficulties might be overcome without resort to complicated or continuing adjustment.

An object of this invention is to provide a high speed transistor counter capable of accurately counting square wave pulses occurring at a high frequency.

Another object of this invention is to provide a high speed transistor counter having steering gates capable of operating at high frequencies.

Other objects and advantages of this invention will be apparent from the following detailed description of one embodiment of the invention, and the novel features will be particularly pointed out hereinafter in connection with the appended claims.

Figure 1:
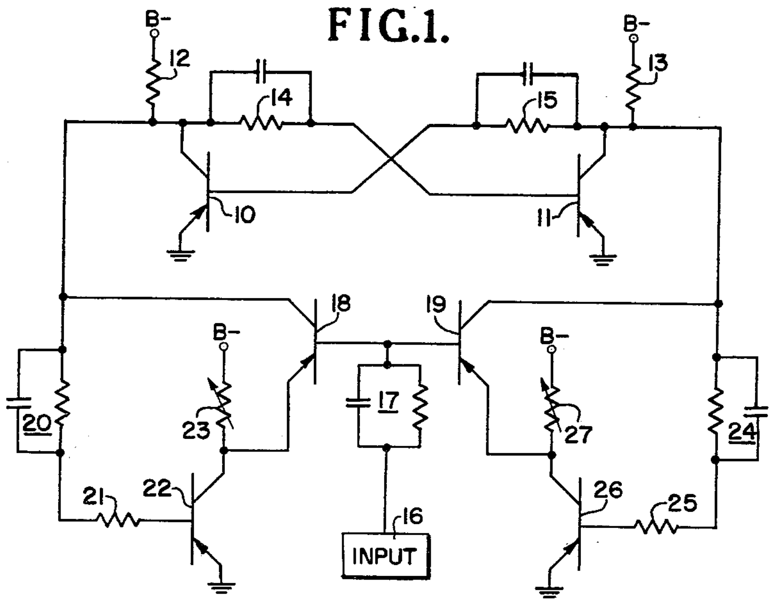
Figure 2:
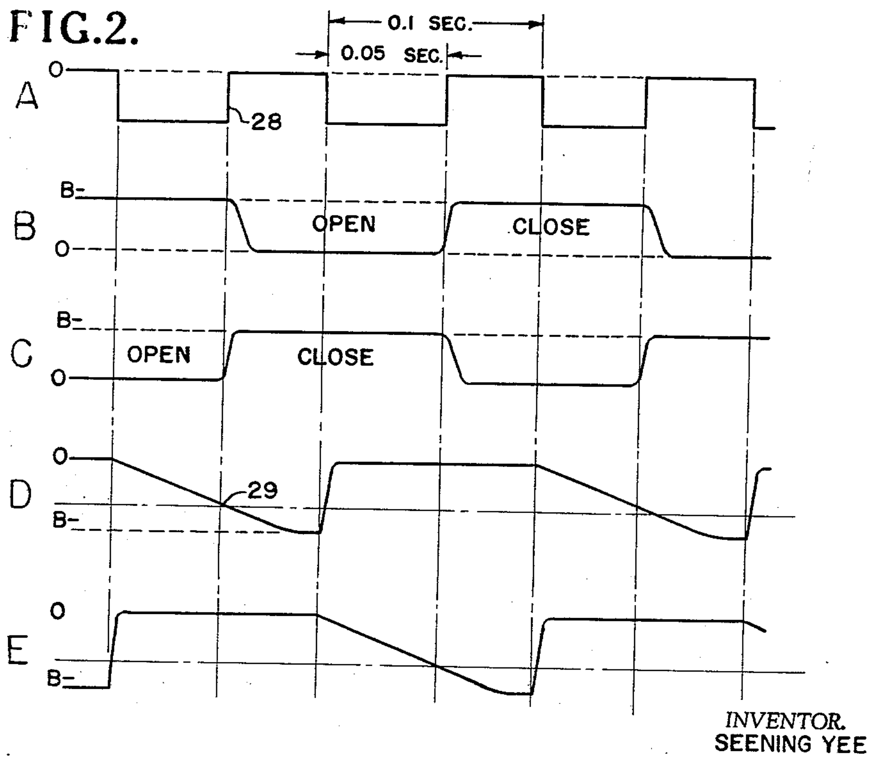

In the accompanying drawing:

FIG. 1 is a circuit diagram of an embodiment of the transistor pulse counter of the invention; and FIG. 2 is a time diagram of various operations within the circuit of FIG. 1.

Referring now to the drawing, a transistor counter circuit having a pair of PNP transistors 10 and 11 cross-connected in the usual manner to provide bistable counter operation. The emitters of both transistors are connected to ground and their collectors are biased in the forward direction by a negative supply voltage applied through the resistors 12 and 13 respectively. The high speed bistable operation of the circuit is accomplished by cross-connecting the collector of the transistor 10 through a resistance-capacitance parallel network to the base of the transistor 11 and connecting the collector of transistor 11 through the resistance-capacitance parallel network 15 to the base of the transistor 10. The operation of transistor bistable counter circuits or flip-flops, as they are commonly known, is such that one of the transistors is in a conducting state while the other of the transistors is maintained in a non-conductive state. When a pulse of proper polarity and magnitude, in this case a negative pulse, is applied during a first stable state to the base of the non-conducting transistor that transistor begins to conduct, thereby causing the voltage at its collector to change in magnitude; the change in magnitude at the collector delivers a pulse of opposite polarity through the cross-connecting circuit to the base of the conducting transistor, thereby causing conduction through that transistor to cease. This second stable state is maintained until a subsequent pulse is received to cause the circuit to again change states.

A source of high frequency input pulses 16 applied ten megacycle square wave pulses to be counted through a resistance-capacitance parallel coupling circuit 17 to the bases of a pair of high frequency transistor gates 18 and 19. These gates operate in a non-saturated condition to provide amplification for an input pulse passing therethrough. The collectors of the transistors 18 and 19 respectively are connected directly to the collectors of the transistors in the flip-flop 10 and 11. One of these gates is maintained open while the other is maintained closed, according to the instant state of the flip-flop circuit, such that the incoming input pulse is steered through the appropriate gate to the collector of the conducting transistor and the flip-flop; this is accomplished by a delay and gate control circuit which utilizes the voltage at the collector of each of the flip-flop transistors 10 and 11 to control the condition of the gates 18 and 19 respectively.

The delay and gate control circuits are a pair of identical feedback circuits connected so that they bias the emitters of gate transistors 18 and 19 separately. The collector of the flip-flop transistor 10 is connected through a resistance-capacitance coupling circuit 20 and a resistance 21 to the base of a high frequency transistor 22. The emitter of control transistor 22 is connected to ground and the collector thereof is held below cut-off by the negative bias B applied through variable resistance 23 when the flip-flop transistor 10 is conducting. When the flip-flop transistor 10 is in its non-conductive state, the amplitude of the negative voltage on its collector is of a higher value and this is applied to the base of transistor 22 which will cause the transistor 22 to assume a conductive state above cut-off and near saturation. When the transistor 22 is thus conducting, the emitter of the gating transistor 18 is effectively connected to ground thereby allowing that transistor to pass and amplify the next input pulse received at its base. The emitter of the transistor 18, however, will be biased more negatively when the transistor 22 is not conducting thus preventing the passage of an input pulse through that gate. The voltage on the collector of the flip-flop transistor 11 is fed back similarly through the coupling circuit 24 and resistor 25 to the base of the controlled transistor 26. The control transistor 26 has its collector similarly biased through a variable resistor 27 and the gating transistor 19 is opened or closed to incoming pulses according to the state of the flip-flop transistor 11.

The delay and amplifier control circuit not only accomplishes the switching for the gating and control transistors, but also provides a controllable delay for the switches with respect to the input pulse. A delay time of a half cycle to a full cycle at the frequency of the input pulses is desirable for the proper operation of this circuit. Assuming that there were no such delay, an input pulse, the first portion of which would initiate the change of state of the flip-flop, would result in the gating transistors 18 and 19 reversing states before the end of the pulse; thus the last portion of that pulse would be passed through the other gating transistor to cause the flip-flop to again change state resulting in a double count for a single pulse. When a similar counter is used to count narrow spike pulses, this delay is not so critical since the spike pulse width is usually only a small fraction of a signal cycle. In this case the sum of the inherent switching delays of the flip-flop transistor and its associated control transistor might be relied upon to provide the necessary delay. In the case of square wave pulses, however, the pulse width is approximately half of the signal cycle; therefore the necessary delay must be accurately maintained between a half and a full cycle period. Now the inherent switching delays of two transistors of the same type may vary by a factor of several times and the selection and matching of a pair of transistors for each side of the counter to provide the delay within these narrow limits is at best a tedious process of trial and error. Also, over the life time of the circuit the inherent delays of the transistors will vary also. The delay and control transistor circuits of this invention take advantage of the switching waveform of the flip-flop to provide an accurate and proper delay. The circuit is constructed of high speed transistors and the proper delay is obtained by adjusting the collector bias on the control transistors 22 and 26.

The operation of the entire circuit is best described by reference to the time diagram of FIG. 2. Waveform A of FIG. 2 represents the ten megacycle pulses to be counted which are received from the input source 16. Assuming that when the first pulse 28 is received by the counter, the flip-flop is in one of its stable states in which the transistor 10 is conducting and the transistor 11 is non-conducting; the approximate waveforms of the voltages existing at the collectors of the transistors 10 and 11 during operation is represented by the waveforms D and E respectively of FIG. 2. With the flip-flop in this condition, the transistor gate amplifier 18 is shut off while the gate transistor 19 is on. The incoming pulse 28 is amplified by the gate transistor 19 and delivered to the collector of the flip-flop transistor 11. The other gating amplifier transistor 18 remains inactive because of its high resistance due to the negative bias voltage on its emitter. When the amplified pulse 28 is delivered to the collector of the flip-flop transistor 11, it is delivered through the cross connection 15 to turn off the transistor 10. As the transistor 10 is being cut-off, the voltage on the collector thereof starts to drop gradually from its previous value near ground toward the negative value of the B minus supply voltage. The voltage at this point is connected to the base of the delay and gate control transistor 22, which is originally in the off condition. The transistor 22 is so biased that it does not become conductive until the collector voltage of the transistor 10 has reached a given cut-off value, which is designated on waveform D as point 29; the value of this cut-off voltage should be so chosen that the transistor 22 will not cut on until the incoming pulse has ceased, in the case of a ten megacycle input pulse this time being between 50 to 100 millimicroseconds. By simply varying the bias on the transistor 22 by use of the variable resistor 23 or by varying the B− voltage this delay time may be lengthened or shortened to stay within the stated limit. Waveforms B and C represent the collector voltages existing during the operation of the circuit of the transistors 22 and 26 respectively. As the transistor 22 is turned on, the negative bias is removed from the emitter of the gating transistor 18 thereby allowing the next input pulse to pass therethrough. At approximately the same time, the incoming pulse 28 has ceased and since the transistor 11 is now conducting the collector voltage thereof is returned close to ground thus shutting off the transistor 26 and closing the gate 19. The operation is continued for each succeeding input pulse as shown by the waveforms in FIG. 2. The high speed of this circuit is achieved by using high frequency transistors, such as are presently available from the prior art, by operating the flip-flop transistors in their non-saturating condition, and by collector triggering by means of the amplified trigger pulses delivered to the non-saturated transistor gates. Multiple switching in the flip-flop is also avoided by the parallel resistance-capacitance circuits in each feedback path.

It will be understood that various changes in the details, elements and arrangement of the circuit which has been herein described and illustrated in order to explain the nature of the invention, may be made by those skilled in the art within the principle and scope of the invention as expressed in the appended claims.

What is claimed as new and desired to be secured by by Letters Patent of the United States is:

1. A high speed binary counter for counting high-frequency square wave pulses comprising; a high frequency bistable circuit having a pair of output terminals wherein said output terminals alternately assume mutually exclusive first and second output voltage levels, said circuit operable to gradually change output voltage levels when a square wave pulse is applied to an output terminal at said first level, gate means connected to said output terminals for applying said square wave pulses to said output terminals, delay and control means connected to said output terminals and to said gate means to selectively control said gate means by changing the state thereof to deliver a square wave pulse only to the output at said first level, said delay and control means having variable bias means coupled thereto to delay a change of state of said gate means until the last portion of said gradual change, said gradual change being of longer duration than the width of said square wave pulses.

2. The binary counter of claim 1 wherein said control and delay means comprises a transistor with variable bias means thereon for maintaining said transistor in one condition until a given voltage level of said gradual change is reached, said transistor having an output connected to control said gate means.

3. The binary counter of claim 2 wherein said bias means may be varied to adjust the amount of delay.

4. A high speed binary counter for counting high frequency square wave input pulses comprising a bistable transistor flip-flop having first and second transistors and impedance means cross-coupling the input and output of said transistors whereby said transistors assume mutually exclusive first and second states; said first and second transistors interchanging their states when an amplified square wave input pulse is applied to the output of said first transistor in said first state; first and second transistor gates each having input, output and control terminals; said input terminals connected to receive square wave input pulses, each gate being operative to amplify said square wave input pulses when received at the input terminal thereof only when an enabling voltage is applied to said control terminal, conductive means connecting the output of said first transistor gate to the output of said first transistor in said flip-flop and connecting the output of said second transistor gate to the output of said second transistor in said flip-flop for supplying in an amplified square wave input pulse to the first and second transistors respectively when said first and second transistor gates respectively are conducting, a pair of switching transistors each having input, output and control electrodes, said control electrodes of said switching transistors being coupled to an output terminal of a respective one of said first and second transistors in said flip-flop, said output electrodes of said switching transistors being coupled to a respective one of said transistor gates, variable bias means connected to the output electrodes of said switching transistors to bias said switching transistors to cutoff until the respective transistor flip-flop output terminals coupled to said control electrodes reaches a predetermined voltage level immediately after the change of state of said flip-flop whereby said switching transistors maintain said respective transistor gates non-conducting until said predetermined voltage level is reached.

5. The binary counter of claim 4 wherein the time constant of said impedance means enables said flip-flop to change gradually from said second to said first state over a time period, the duration of which is longer than the pulse duration of any square wave input pulse applied to said transistor gates.

References Cited in the file of this patent

UNITED STATES PATENTS

| | | |
|---|---|---|
| 2,885,574 | Roesch | May 5, 1959 |
| 2,909,678 | Jensen | Oct. 20, 1959 |
| 2,916,638 | Clark | Dec. 8, 1959 |
| 2,924,725 | Blair | Feb. 9, 1960 |
| 2,945,965 | Clark | July 19, 1960 |
| 3,045,128 | Skerrit | July 17, 1962 |